United States Patent [19]
Hattori

[11] Patent Number: 5,781,570
[45] Date of Patent: Jul. 14, 1998

[54] ERROR PROCESSING METHOD OF ADPCM VOICE TRANSMISSION SYSTEM AND APPARATUS THEREFOR

[75] Inventor: Takeshi Hattori, Tokyo, Japan

[73] Assignee: NEC Corporation, Tokyo, Japan

[21] Appl. No.: 629,471

[22] Filed: Apr. 10, 1996

[30] Foreign Application Priority Data

Apr. 12, 1995 [JP] Japan .................. 7-110235

[51] Int. Cl.$^6$ .................. H04L 1/00; H04L 1/20
[52] U.S. Cl. .................. 371/53; 371/57.2; 375/254
[58] Field of Search .................. 371/53, 57.2; 375/254

[56] References Cited

U.S. PATENT DOCUMENTS

| | | | |
|---|---|---|---|
| 4,967,413 | 10/1990 | Otani | 371/37.4 |
| 5,309,443 | 5/1994 | Schorman | 371/5.5 |
| 5,383,202 | 1/1995 | Edgar et al. | 371/30 |

FOREIGN PATENT DOCUMENTS

| | | |
|---|---|---|
| 4-263528 | 9/1992 | Japan . |
| 2291570 | 1/1996 | United Kingdom . |

*Primary Examiner*—Stephen M. Baker
*Attorney, Agent, or Firm*—Sughrue, Mion, Zinn, Macpeak & Seas, PLLC

[57] ABSTRACT

Reception signal strength of ADPCM voice data in a transmission frame is detected every ADPCM voice data in an RSSI detecting section (2), and when a base band processing section (3) effects decision of existence of error regarding ADPCM voice data of a reception frame, only for the ADPCM voice data with the reception signal strength less than the predetermined value, the difference value is made small or made zero in an ADPCM voice data conversion processing unit (7) and then the value is decoded in an ADPCM decoding processing unit (8). ADPCM data without error are decoded as it is.

4 Claims, 5 Drawing Sheets

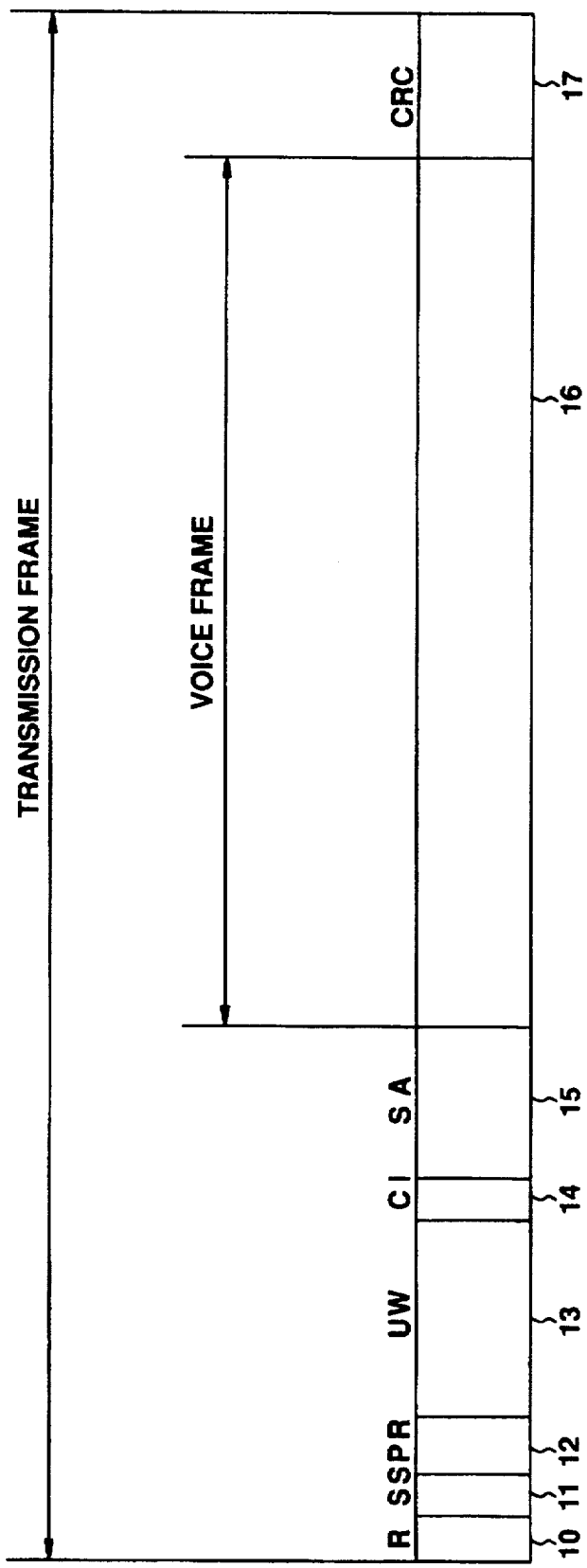

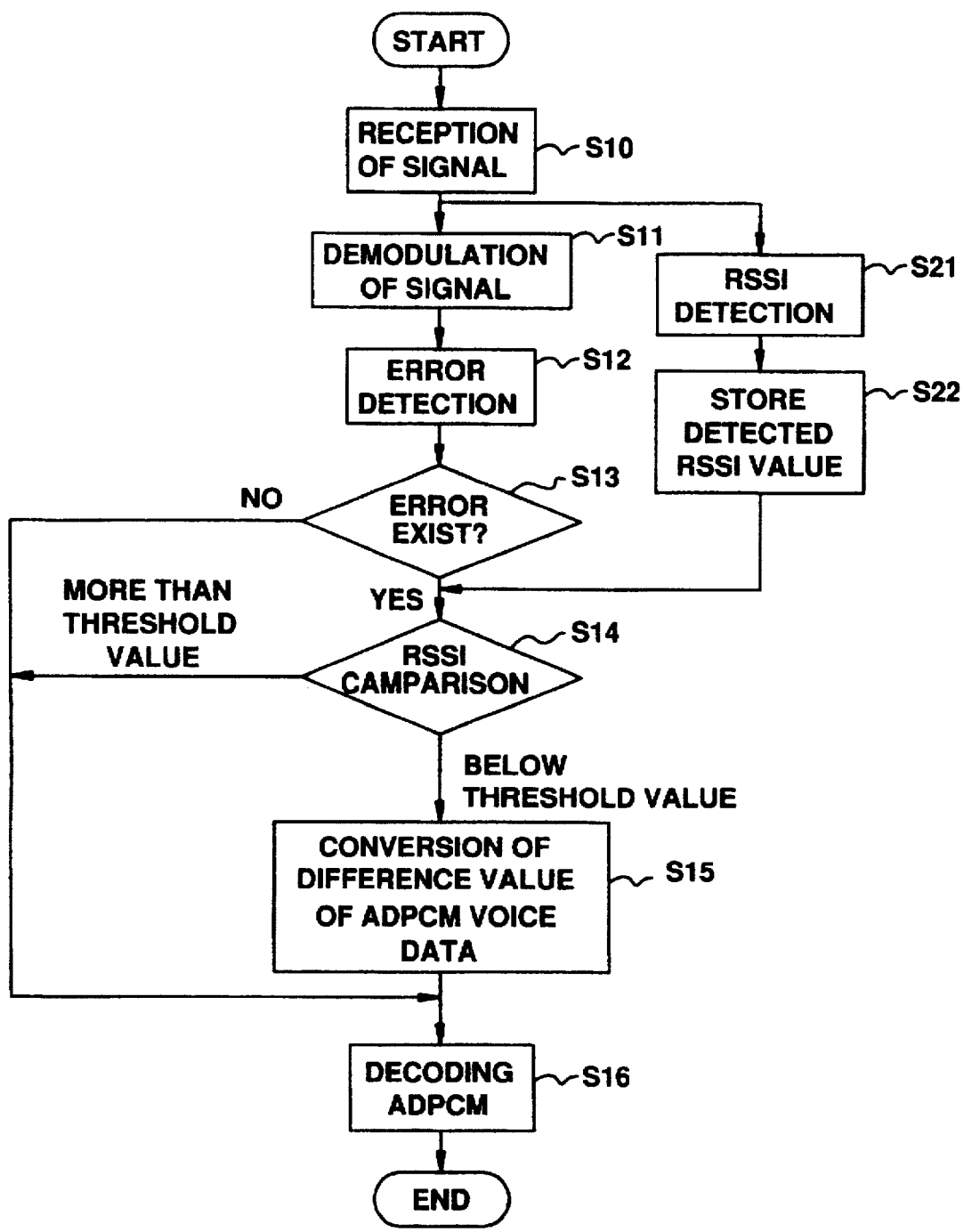

ERROR PROCESSING METHOD OF ADPCM VOICE TRANSMISSION SYSTEM AND APPARATUS THEREFOR

BACKGROUND OF THE INVENTION

1. Field of the Invention

The present invention relates to ADPCM (Adaptive Differential Pulse Code Modulation) voice transmission system where voice data are subjected to differential quantization and transmitted in ADPCM system, for example, mobile communication system in time division multiplex system, and more particularly to an error processing method in ADPCM voice transmission system and an apparatus therefor where quality degradation of voice data can be suppressed to small degree at the reception side when error is produced.

2. Description of the Related Art

In a personal handyphone system (hereinafter referred to as "PHS") which is one of applications of mobile communication system, when error of a cyclic redundancy check code (hereinafter referred to as "CRC code") is generated or when error of a unique word (hereinafter referred to as "UW") to check establishment of synchronization is generated, an error correction code is not used but this state is dealt with by mute processing.where all voice data in the error generating frame are replaced by silent data or by reuse processing where voice data in the preceding frame are used repeatedly.

However, in the mute processing as above described, since the voice data becomes silent suddenly, click noise is generated. Also in the reuse processing as above described, the voice data after eliminating the error is not normal state and further when data in the frame as a whole are replaced, also the correct data are replaced. As the measure therefor, there is a method that when the ADPCM voice data are the maximum difference value, the data are converted so that the difference value is made small or 0. In this method, the data are processed in the whole frame during the error detection, even the voice data not necessitating conversion are converted and the sufficient voice quality can not be obtained.

On the other hand, although its technical specification is different from that of the PHS, JPA No. 263528/1992 discloses a voice muting system as the related art as follows.

This system, as shown in FIG. 1, comprises a demodulator 10 for demodulating a received transmission frame, an error detector 12 for detecting error in the demodulated frame, a first muting circuit 11 for conducting muting of the ADPCM voice data according to a signal from the error detector 12, an ADPCM decoding section 13 for converting the ADPCM voice data into analog voice signals, and a second muting circuit 14 for conducting muting regarding the analog voice signals according to a signal from the error detector 12.

In this system in the related art, to a transmission frame constituted by a preamble (PR) 30, a UW 31, a voice frame 32 by ADPCM and a CRC code 33 as shown in FIG. 2, error detection is conducted by the CRC code 33 in every transmission frame or in every block in dividing the voice frame 32 into a plurality of blocks, and all signals within the voice frame 32 including error or all signals within the block are replaced by specific patterns or by signals subjected to signal conversion immediately before this.

In such system, however, since signals are replaced in voice frame unit or in block unit, even correct voice data within the voice frame or within the block may be replaced therefore this system is insufficient for the improvement of the voice quality.

SUMMARY OF THE INVENTION

In view of the above-mentioned problems in the prior art, an object of the present invention is in that only the ADPCM voice data with error generated actually within the error frame are extracted, and the data are converted only for the voice data, thereby the degradation of the voice quality during the error generation is suppressed to the minimum degree and the high quality of the voice is intended.

In the present invention, in an ADPCM voice transmission system where a transmission frame including voice data subjected to differential quantization in ADPCM system, unique words (UW) for checking establishment of frame synchronization and cyclic redundancy check codes (CRC code) is transmitted and then the voice data are decoded by a detecting section at the reception side, error is processed by following manner.

(1) It is detected whether error of the unique word exists or not and whether error of the cyclic redundancy check code exists or not from the received transmission frame.

(2) Reception signal strength indicator (hereinafter referred to as "RSSI") of the ADPCM voice data within the received transmission frame is detected in every ADPCM voice data.

(3) Decision is effected regarding whether the detected reception signal strength is less than the definite value or not. The decision can be conducted in that the detected reception signal strength is stored in a memory and the stored value is compared with the threshold value.

(4) When error of the unique word or error of the cyclic redundancy check code is detected and the reception signal strength is less than the definite value, the difference value of the ADPCM voice data is converted and inputted to the decoding section. The conversion in this case is preferably conducted in that when the difference value of the ADPCM voice data is large, the difference value is made zero or replaced by a smaller value.

In the present invention, as described above, the reception signal strength of the ADPCM voice data within the reception frame is detected in every ADPCM voice data, and the ADPCM voice data with the reception signal strength less than the definite value are extracted from the reception frame with error detected, and only the voice data are subjected to the data conversion, that is, the difference value shown by the voice data is made small or made zero thereby the degradation of the voice quality is suppressed to the minimum degree.

BRIEF DESCRIPTION OF THE DRAWINGS

FIG. 4 is a format diagram of a transmission frame in a personal handyphone system; and FIG. 5 is a flowchart showing an error processing operation according to the present invention.

DETAILED DESCRIPTION OF THE PREFERRED EMBODIMENTS

The present invention applied to a PHS will be described in the following by referring to the attached drawings.

Figure 1:
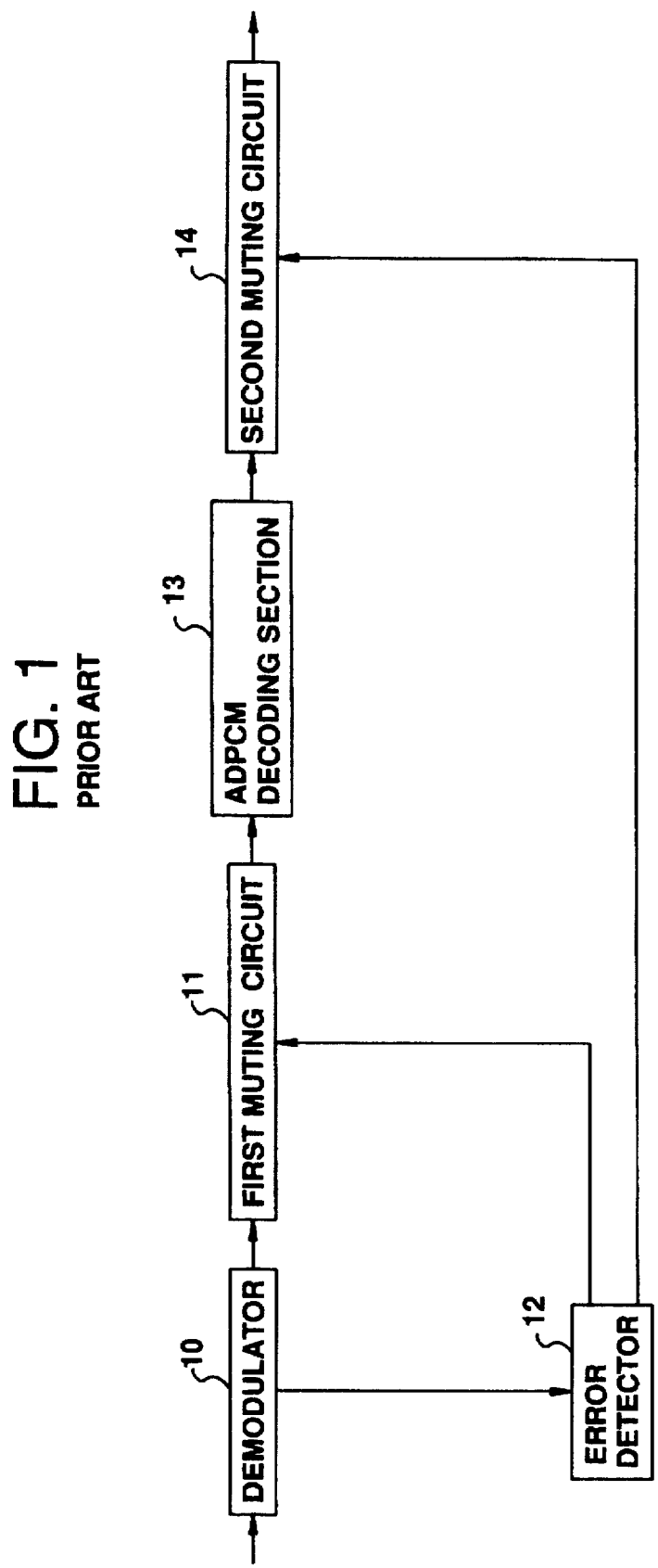
FIG. 1 is a block diagram showing schematic configuration of an ADPCM voice processing system in a mobile communication system using time division multiplex system in the prior art.
Figure 2:
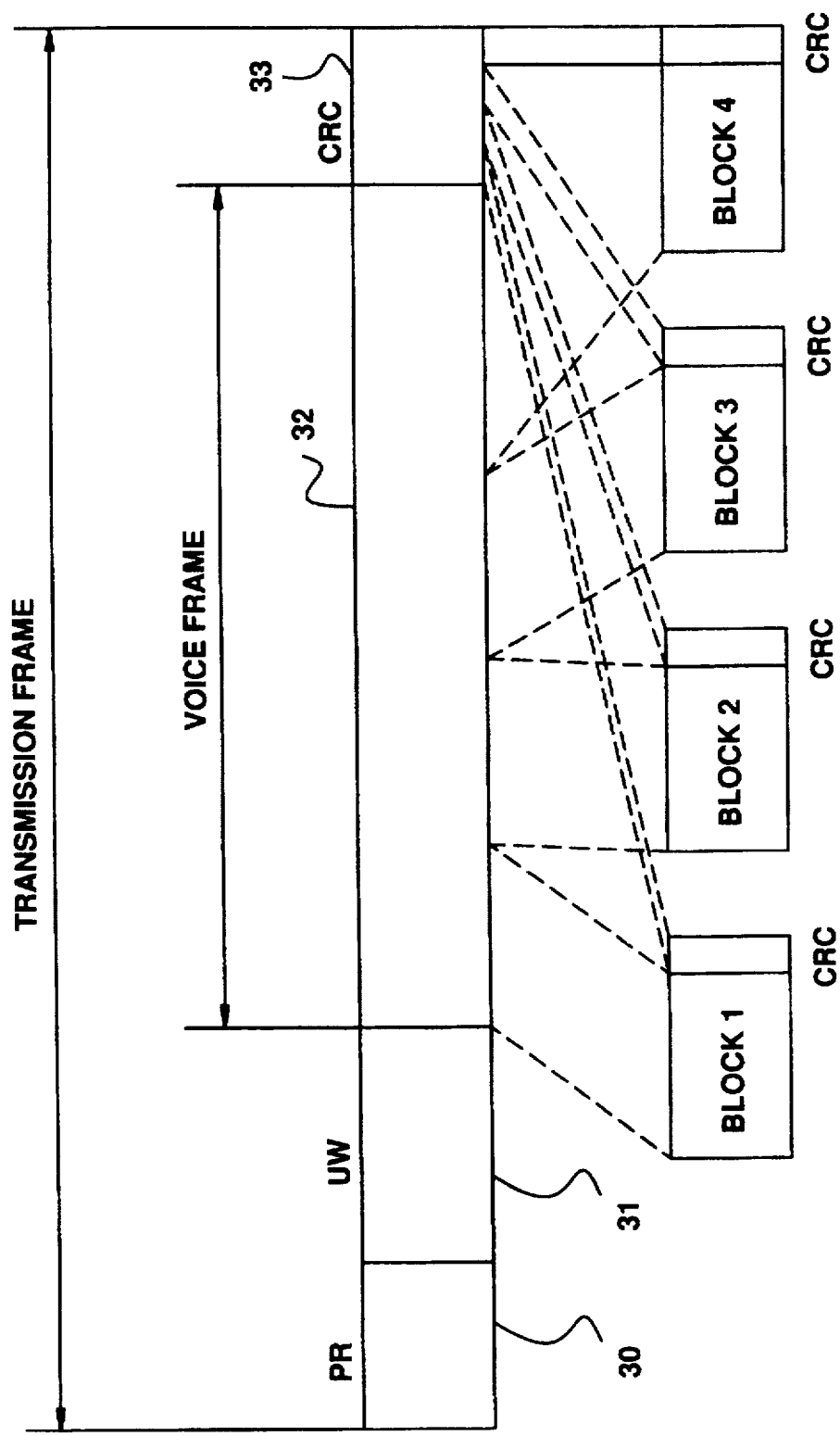
FIG. 2 is a diagram showing configuration of a transmission frame and a method of dividing a voice frame into blocks and detecting error in the prior art shown in FIG. 2.
Figure 3:
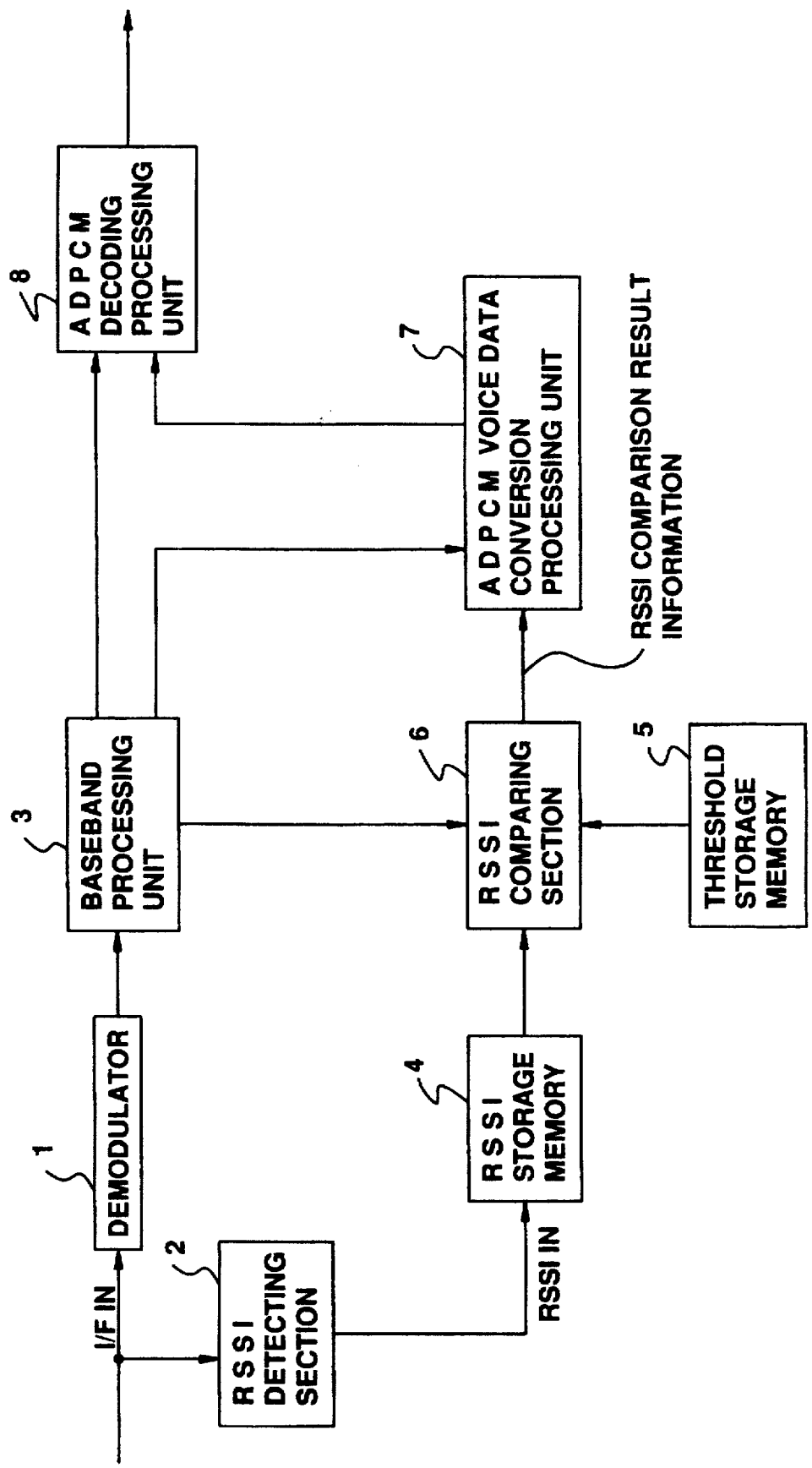
FIG. 3 is a block diagram showing schematic configuration of an ADPCM voice control section at the reception side of a personal handyphone system to which the present invention is applied.

FIG. 3 shows a schematic configuration of an ADPCM voice control section at the reception side of a PHS to which the present invention is applied.

The ADPCM voice control section comprises a demodulator 1 for demodulating received data, an RSSI (reception signal strength indicator) detecting section 2 for detecting RSSI of each of the ADPCM voice data from a reception frame before the demodulation, a base band processing unit 3 capable of detecting whether error of a CRC code exists or not and whether error of a UW exists or not from the reception frame after the demodulation, an RSSI storage memory 4 for temporarily storing the detected RSSI, a threshold storage memory 5 for storing the threshold value as reference of comparing the degree of the RSSI, an RSSI comparing section 6 for comparing the threshold value with the RSSI stored in the RSSI storage memory 3, an ADPCM voice data conversion processing unit 7 for converting the difference value of the ADPCM voice data when the RSSI is less than the threshold value, and an ADPCM decoding processing unit 8. In addition, each of the ADPCM voice data is constituted by 4 bits.

FIG. 4 shows format of the transmission frame in the PHS.

One transmission frame is constituted by transient responding ramp time 10, start symbol 11, preamble 12, UW 13, channel identification code 14, SACCH (Slow Associated Control Channel) 15, ADPCM voice data 16 and CRC code 17, and frame error is detected by the UW 13 and the CRC code 17.

Next, operation of this embodiment will be described with reference to FIGS. 3, 4 and 5.

In the demodulator 1 shown in FIG. 3, data received from the opposite station are demodulated and the demodulated data are outputted to the base band processing unit 3 (the step S11). Also in the RSSI detecting section 2, RSSI of the ADPCM voice data 16 is detected in each symbol (2 bits), and the detected RSSI is written in the RSSI storage memory 4 (the steps S21 and S22).

The base band processing unit 3 inputting the received data after the demodulation includes error detecting means (the step S12). When error of one bit or more is detected from the CRC code within the reception frame, the error detection means effects decision that the CRC error exists. Also when error of 2 bits or more is detected from the UW, the detecting means effects decision that the UW error exists. According to the decision by the error detecting means regarding whether error exists or not, the base band processing unit 3 outputs the voice data as it is to the ADPCM decoding processing unit 8 if error does not exist (the step S13: No). Whereas if error exists (the step S13: Yes), the base band processing unit 3 outputs information indicating existence of error to the RSSI comparing section 6 and also outputs the voice data corresponding to one frame to the ADPCM voice data conversion processing unit 7.

On receiving information indicating existence of error from the base band processing unit 3, the RSSI comparing section 6 reads the RSSI in every symbol from the RSSI storage memory 4 and extracts lower RSSI among the two RSSIs in every ADPCM voice data (constitution in 4 bits). The RSSI in each of the extracted ADPCM voice data is compared with the threshold value stored previously in the threshold storage memory 5 (the step S14), and decision is effected regarding whether the RSSI is less than the threshold value or not, that is, whether the RSSI is dropped lower than the definite value or not, and the result information is outputted to the ADPCM voice data conversion processing unit 7.

When the result information from the RSSI comparing section 6 indicates that the dropping exists (the step S14 below threshold value), the ADPCM voice data conversion processing section 7 effects decision that error exists in the ADPCM voice data, and when the difference value of the ADPCM voice data inputted from the base band processing unit 3 is large (for example, when the 4-bit data are 7 or −7), the difference value is made zero or subjected to the data conversion into smaller value (the step S15), and outputted to the ADPCM decoder 8.

When the result information from the RSSI comparing section 6 indicates that the dropping does not exist (the step S14 : more than threshold value), the ADPCM voice data inputted from the base band processing unit 3 is outputted to the ADPCM decoder 8 without conversion.

As above described, in the present invention, since reception signal strength of ADPCM voice data in a reception frame is detected in every ADPCM voice data, and the ADPCM data with the reception signal strength less than the definite value are extracted from the reception frame with error detected, and only the voice data are subjected to the data conversion, that is, the, difference value is made small or made zero and then the data are decoded, the degradation of the voice quality during the frame error generation can be suppressed to the minimum degree and the high quality of the voice can be intended.

Although the embodiment applied to the PHS has been described, the present invention is not limited to the PHS but can be widely applied to a digital communication system transmitting voice data by the ADPCM system. Therefore, unless various changes and modifications being apparent to those having skill in this field otherwise depart from the scope of the present invention, they should be construed as included therein.

What is claimed is:

1. An error processing method of an ADPCM voice transmission system where a transmission frame including voice data subjected to differential quantization in ADPCM system, unique words checking establishment of synchronization and cyclic redundancy check codes is transmitted, and the voice data are decoded by a decoding section at the reception side, said method comprising the steps of:

detecting whether error of the unique words exists or not and whether error of the cyclic redundancy check codes exists or not from said received transmission frame;

detecting the reception signal strength of the ADPCM voice data in the received transmission frame in every ADPCM voice data;

effecting decision whether the detected reception signal strength is less than a predetermined value or not when error of the unique word or error of the cyclic redundancy check codes being detected; and converting the difference value of the ADPCM voice data and inputting the converted value to said decoding section, when error of the unique words or error of the redundancy check codes is detected and the reception signal strength is less than the predetermined value.

2. An error processing method of an ADPCM voice transmission system as set forth in claim 1, wherein conversion of the difference value of the ADPCM voice data is that when the difference value is large, the difference value is replaced by a small value including 0.

3. An error processing method of an ADPCM voice transmission system as set forth in claim 1, wherein decision whether the reception signal strength is less than the predetermined value or not is effected in that the detected reception signal strength is stored in a memory and the stored value is compared with the threshold value.

4. An error processing apparatus of an ADPCM voice transmission system where a transmission frame including voice data subjected to differential quantization in ADPCM system, unique words checking establishment of synchronization and cyclic redundancy check codes is transmitted, and the voice data are decoded by a decoding section at the reception side, said apparatus comprising:

means for detecting whether error of the unique words exists or not and whether error of the cyclic redundancy check codes exists or not from said received transmission frame;

means for detecting the reception signal strength of the ADPCM voice data in the received transmission frame in every ADPCM voice data;

means for effecting decision whether the detected reception signal strength is less than the threshold value or not; and means for converting the difference value of the ADPCM voice data into a small value including 0 and inputting the converted value to said decoding section, when error of the unique words or error of the redundancy check codes is detected and the reception signal strength is less than the threshold value.

* * * * *